United States Patent [19]
Stengl et al.

[11] Patent Number: 5,844,266
[45] Date of Patent: Dec. 1, 1998

[54] BURIED STRAP FORMATION IN A DRAM TRENCH CAPACITOR

[75] Inventors: Reinhard Stengl, Stadtbergen, Germany; Erwin Hammerl, Stormville, N.Y.; Herbert L. Ho, Washingtonville, N.Y.; Jack A. Mandelman, Stormville, N.Y.; Radhika Srinivasan, Wappinger Falls, N.Y.; Alvin P. Short, Poughkeepsie, N.Y.

[73] Assignee: Siemens Aktiengesellschaft, Munich, Germany

[21] Appl. No.: 879,871

[22] Filed: Jun. 20, 1997

Related U.S. Application Data

[62] Division of Ser. No. 605,622, Feb. 22, 1996.

[51] Int. Cl.<sup>6</sup> .................................................. H01L 21/8242
[52] U.S. Cl. ......................... 257/301; 438/248; 438/249; 438/391; 438/392; 438/243; 438/386
[58] Field of Search ............................. 257/301; 438/243, 438/245, 248, 249, 356, 389, 391, 392

[56] References Cited

U.S. PATENT DOCUMENTS

| | | | |
|---|---|---|---|
| 5,372,966 | 12/1994 | Kohyama | 438/243 |
| 5,389,559 | 2/1995 | Hsieh et al. | 438/243 |
| 5,395,786 | 3/1995 | Hsu et al. | 438/248 |
| 5,525,531 | 6/1996 | Bronner et al. | 438/386 |
| 5,543,348 | 8/1996 | Hammerl et al. | 438/392 |
| 5,555,520 | 9/1996 | Sudo et al. | 257/301 |
| 5,593,912 | 1/1997 | Rejeevakumar | 438/696 |
| 5,614,431 | 3/1997 | DeBrosse | 438/243 |
| 5,719,080 | 2/1998 | Kenny | 438/243 |

*Primary Examiner*—Michael Trinh
*Assistant Examiner*—Toniae M. Thomas
*Attorney, Agent, or Firm*—Stanton C. Braden

[57] ABSTRACT

In a method for making an electrical connection between a trench storage capacitor and an access transistor in a DRAM cell, the electrical connection is formed through the selectively controlled outdiffusion of either N-type or P-type dopants present in the trench through a single crystalline semiconducting material which is grown by epitaxy (epi) from the trench sidewall. This epitaxially grown single crystalline layer acts as a barrier to excessive dopant outdiffusion which can occur in the processing of conventional DRAMs.

5 Claims, 6 Drawing Sheets

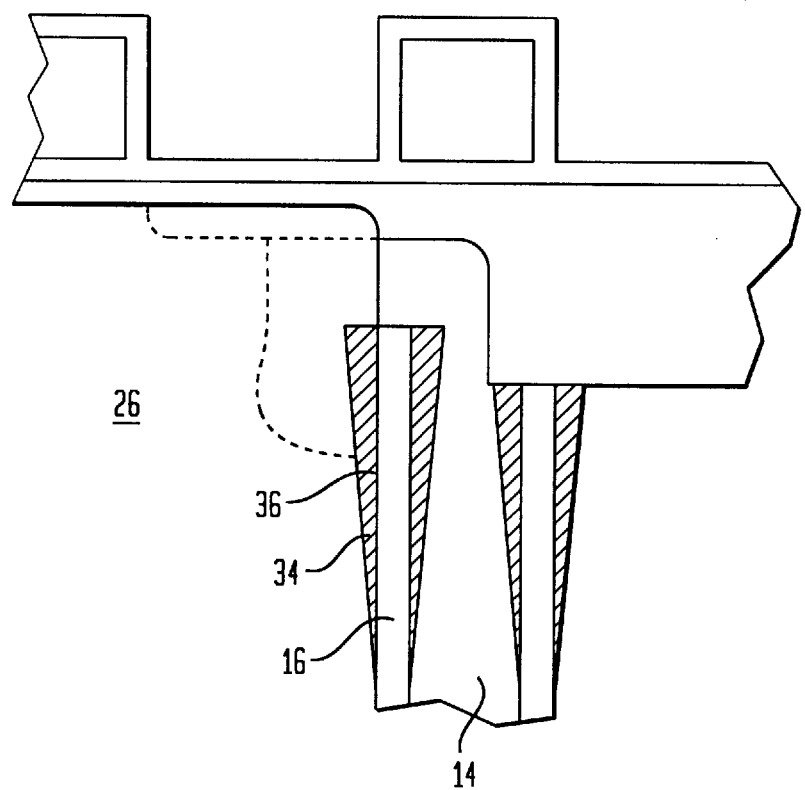

BURIED STRAP FORMATION IN A DRAM TRENCH CAPACITOR

This is a divisional of application Ser. No. 08/605,622 filed Feb. 22, 1996, allowed.

FIELD OF THE INVENTION

The field of the present invention relates generally to dynamic random access memories (DRAMs), and more specifically to a process for making an electrical connection between a trench storage capacitor and an access transistor in a 256 Mb DRAM cell.

BACKGROUND OF THE INVENTION

Dynamic random-access memory (DRAM) cells are composed of two main components, a storage capacitor (which stores charge) and an access transistor (which transfers charge to and from the capacitor). The capacitor may be either planar (on the surface) or trench (etched into the semiconductor substrate). In the semiconductor industry where there is an increased demand for memory storage capacity coupled with an ever decreasing chip size, the trench capacitor layout is favored over the planar capacitor design because this particular setup results in a dramatic reduction in the space required for the capacitor without sacrificing capacitance.

A very important and extremely delicate element in the DRAM cell is the electrical connection made between the storage trench and the access transistor. Such a contact is often referred to in the art as a self-aligned conductive strap. This strap (which may be on the surface or may be buried) is formed at the intersection of the storage trench and the junction of the array device by dopants which, through a thermal processing step, are outdiffused from the highly doped poly-silicon fill (located in the storage trench) into the substrate (from which the trench was cut). One such method for preparing a self-aligned buried strap in a 256 Mb DRAM cell is illustrated in U.S. Pat. No. 5,360,758 entitled "SELF-ALIGNED BURIED STRAP FOR TRENCH TYPE DRAM DEVICES" issued to Bronner et al. This method uses a simple polysilicon strap which connects the collar at the top of the capacitor to the pass transistor of the cell, and is formed from a blanket deposition of strap material which is subsequently removed from top surfaces by further etching processes. The strap is formed without the need for an additional mask, commonly practiced in the art, by using a step of forming a shallow trench isolation (STI) to define the strap.

Several other technologies for forming straps between a trench storage capacitor and a DRAM array device are described in U.S. Pat. No. 5,398,559 entitled "METHOD OF FORMING INTEGRATED INTERCONNECT FOR VERY HIGH DENSITY DRAMS" issued to Hsieh et al. The technologies described therein involve the deposition of a conductive layer (doped polysilicon is preferred) which is later formed into a strap. The complete process involves the formation of a trench capacitor in a silicon substrate (as discussed above), followed by the deposition of a layer of doped polysilicon or other conductive material over the substrate. The polysilicon layer is then selectively removed from parts the substrate and a second, more shallow, trench is then etched into the substrate. This second trench is then filled with oxide, and pass gates are made on the substrate according to well known procedures familiar to those practicing the art. To complete the processing, the pass transistors are then strapped to the trench capacitors with the remaining portions of the doped polysilicon layer.

A schematic drawing of a 256 Mb trench DRAM cell equipped with a conventional strap 10 is depicted in FIG. 1A. The structure consists of a trench capacitor 20 which is etched into a single crystal P-doped silicon substrate 26. The lower level of the trench 12 is typically filled with an N-doped polysilicon material which is isolated from the P-doped substrate by an insulating node dielectric barrier 24. Alternatively, the trench may be filled with a P-doped polysilicon material, should P-doping be required. The storage node 14 of the capacitor in the trench is connected to the pass transistor's source 29 by a self-aligned buried strap 10. It has been found that this strap should be as small as possible, and an ideally sized strap should be one which protrudes less than 0.1 $\mu$m laterally into the P-doped well 26 and vertically no more than the thickness of the shallow trench isolation (STI) 28 which isolates this cell from adjacent cells. The capacitor's opposite plate is formed by an N+ region outdiffused from the deep trench sidewalls. The DRAM cell includes a bit line 27 which runs horizontally connecting the cell's bit line contact 25 to other cells' bit line contacts. One of the DRAM's word lines 23 forms the pass gate 29 to an adjacent cell. A second array word line 15 runs vertically, passing over the trench capacitor and partially over a shallow trench isolation (STI) region 28, forming pass gates for other adjacent cells.

Typically, the strap 10 (in FIG. 1A) that connects the storage plate 14 to the pass gate 29 in a DRAM cell is formed in a conventional thermal process which allows the N(or P)-type dopants present in the trench 12 to diffuse upwards through the storage plate 14 (which is undoped and made of polysilicon) and into the P-doped well 26 through a narrow opening 18. The dopants cannot diffuse through the node dielectric 24 or oxide collar 16. The object of the process is to limit the size of this outdiffused buried strap region by impeding the flow of N-type dopants into the P-type well region.

There are two major problems associated with prior art buried strap formation techniques. The first is that after the buried strap has been formed, the thermal budget of any further process is limited. This means, quite simply, that once the strap has been formed, the system can only tolerate a limited exposure to elevated temperatures during further processing. The limited thermal budget after buried strap formation is particularly detrimental because oxidation steps, needed in order to heal implantation damage or to relieve stress built up in the silicon substrate during the cell's formation process, are then limited to lower, less effective temperatures. Exceeding the cell's temperature exposure limit leads to an excessive dopant outdiffusion from the trench poly-4silicon fill underneath the transfer gate and towards the neighboring memory cells. This dopant outdiffusion results in unacceptable changes in the transfer device characteristics of the cell as well as possible electrical leakage between neighboring cells.

An example of this is phenomenon shown in FIG. 1B which depicts the simulated buried strap outdiffusion experienced in a prior art 256 Mb DRAM cell of FIG. 1A after being subjected to a thermal budget equal to 90 min of further DRAM processing at 1050° C. As can be seen, excessive dopant outdiffusion has occurred resulting in a strap 30 having a size that may be detrimental to the device.

An ideal sized strap 32 and the strap made with conventional processing 10 (shown with broken lines) have been provided in the figure for comparison purposes.

The reason for the excessive dopant outdiffusion is related to a second problem that is associated with prior art buried strap formation processes. This problem involves the generation of extended crystal defects at the interface of the poly-crystalline trench fill and the silicon substrate. This interface is located next to the area where the oxide collar 16 expands most during the oxidation steps of the fabrication process, and is therefore exposed to the highest stress field. During the oxidation steps, the poly-silicon trench fill 14 connected to the single-crystalline silicon substrate starts to recrystallize in an uncontrolled manner over a distance which can be as far as the width of the collar oxide. Due to the inherent high stress field, crystal defects in the polycrystalline grains (including twins, stacking faults, etc.) act as seeds for defect formation at the interface with the neighboring substrate. When this occurs, the crystal defects which are generated there are pushed far into the substrate where they can be detrimental to the device.

The result of the oxidation process that follows buried strap formation in accordance with prior art techniques is depicted in FIG. 1C. During this process, oxygen can diffuse from the substrate surface 36 into the collar oxide 16 and oxidize the sidewalls of the poly-silicon trench fill 14 and the substrate 26. This collar expansion 34 leads to a high stress level and to the generation of extended crystal defects in the substrate such as dislocations and stacking faults around the most expanded part of the oxide collar, which can thereby cause electrical leakage across the junctions of the associated transistor. If the stress built up during one or several oxidation steps is below the critical level to generate crystal defects, and if there is enough thermal budget to relieve this stress by thermal anneals after the oxidation steps, then the formation of extended crystal defects can be prevented. Therefore, a high thermal budget which allows proper stress relief anneals is essential for a successful fabrication of a DRAM with the deep trench and buried strap concept.

It is, therefore, an object of the present invention to provide an improved method for connecting an access transistor to a trench storage capacitor of a 256 Mb DRAM cell which allows a much higher thermal budget for further DRAM processing than prior art methods and enables appropriate stress relief without excessive dopant outdiffusion.

SUMMARY OF THE INVENTION

A method for making an electrical connection between a trench storage capacitor and an access transistor in a DRAM cell in which the connection is formed through the use of an epitaxially grown single crystalline silicon layer. The trench storage capacitor is formed by etching a well into a substrate of a semiconducting material having a dopant which causes the semiconducting material to be of a first conductivity, lining the well with a semiconducting material having a dopant which causes the semiconducting material to be of a second conductivity, and allowing the dopant which causes the second conductivity to partially diffuse into the original substrate. The partially diffused dopant of the second conductivity completely surrounds the trench, and the well, which is filled with a semiconducting material having a dopant which causes the semiconducting material to be of one the first and second conductivities, is isolated from the original substrate by a layer of dielectric material. The trench is then recess etched and an insulating oxide collar is formed. The newly formed trench, which is not as deep as the original trench, is then filled with either doped or undoped polysilicon. The trench is etched a third time to reveal the trench sidewall from which a single crystalline silicon layer is grown using epitaxy (epi). The epitaxy may be selective or non-selective. The non-selective epitaxy process is accompanied by a polishing step which is not needed if selective epitaxy is chosen. The process of forming the actual electrical connection between the trench storage capacitor and the access transistor is completed by forming the active area of the access transistor which causes the dopants present in the storage trench to selectively outdiffuse through the polysilicon fill region and the epitaxially grown single crystalline semiconducting layer, into a selected portion of the original well.

BRIEF DESCRIPTION OF THE DRAWINGS

In order to better understand the present invention, reference should be made to the following detailed description taken in conjunction with the accompanying drawings wherein:

FIG. 1C depicts the expansion of the collar oxide layer of the trench cell of FIG. 1A during the oxidation process following the formation of the buried strap;

DETAILED DESCRIPTION OF THE INVENTION

The present invention provides an improved method for forming an electrically conducting strap between an access transistor and a storage capacitor in a DRAM cell. A 256 Mb DRAM cell 40 constructed in accordance with the present invention is depicted in FIGS. 2A–2H and 3.

Figure 2A:
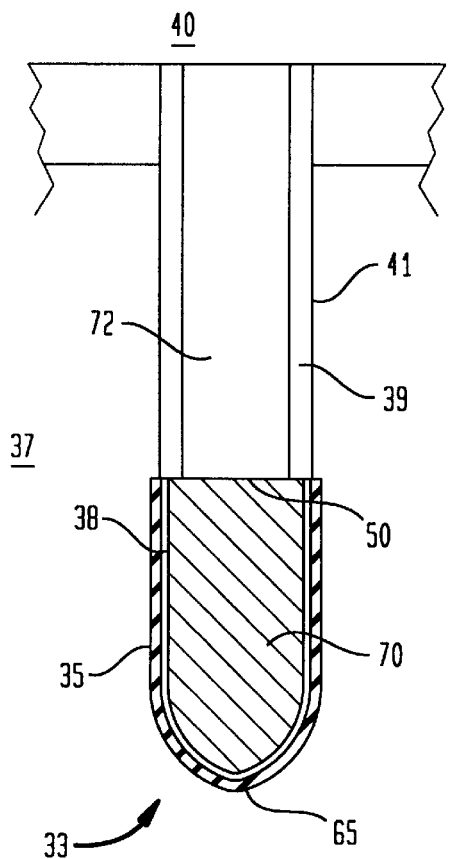
FIG. 2A depicts the deep trench of a DRAM cell as it appears in the initial stages of the inventive method.

Referring to FIG. 2A, the DRAM 40 consists of a P-well 33 which is formed by etching a deep trench down to a first level 65 into a P-type silicon substrate 37 which has been doped with boron at $2\times10^{17}$ cm$^{-3}$. The formation of this trench is conventional and well known to those skilled in the art. The depth of the trench is not critical, and may be chosen for convenience. A buried-plate 70 is then formed in the P-type silicon substrate 37 by covering the freshly excavated trench with a thin layer of arsenic doped tetraethyloxysilane (TEOS) and allowing the N-type dopants to partially diffuse into the P-type substrate. This creates a layer 35 of N-type dopants which surrounds the trench isolating the P-well 33 from the P-substrate 37. A thin node dielectric 38 is then formed on the trench sidewalls and the trench is filled with polysilicon doped with arsenic at $5 \times 10^{19}$ cm$^{-3}$. Alternatively, the trench may be filled with a P-carrier if P-type doping is desired. The N-(or P-)doped polysilicon is then recess etched to a second level 50. A 50 nm CVD oxide layer is then deposited and an oxide collar 39 is formed by using a spacer etching technique. The trench is then refilled with either doped or undoped polysilicon 72. Up to this point, processing of the 256 Mb DRAM has been conventional.

Figure 2B:
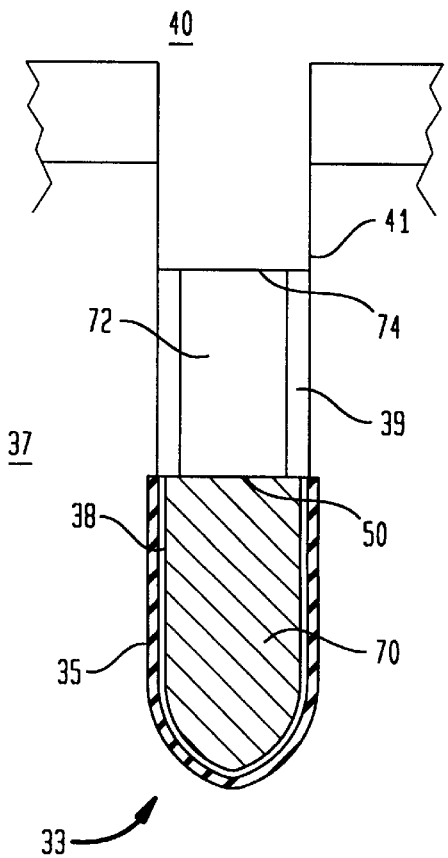
FIG. 2B depicts the deep trench of a DRAM cell as it appears prior to the epitaxial growth technology of the present invention.

Referring now to FIG. 2B, the polysilicon layer 72 is recess etched to a third level 74 which has a depth of, typically, 100 to 200 nm. In this etch, the oxide collar 39, produced in the aforementioned steps, is also removed along the silicon trench sidewall 41 down to the top 74 of the polysilicon 72 that forms the storage plate.

Figure 2C:
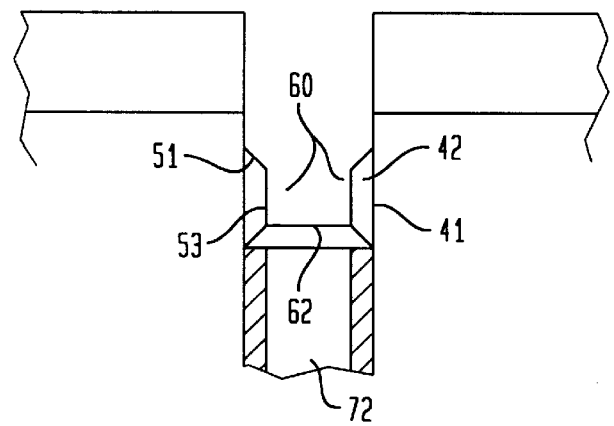
FIGS. 2C–G depict different stages of epitaxial growth of a single crystalline silicon region which occurs according to the process of the present invention.
Figure 2D:
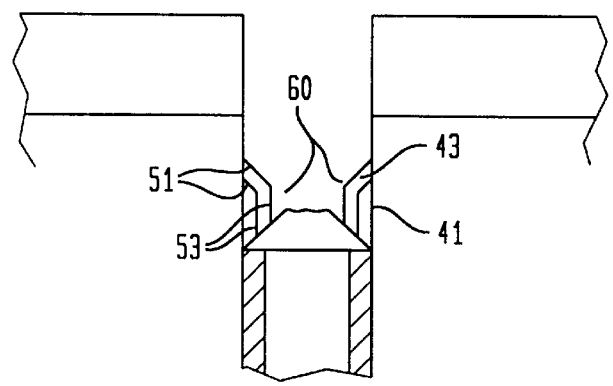
Figure 2E:
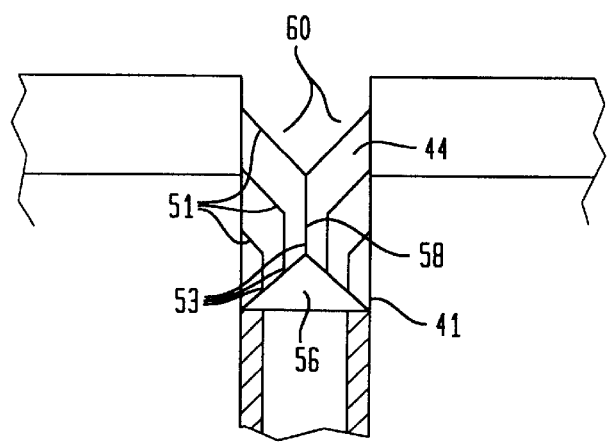
Figure 2F:
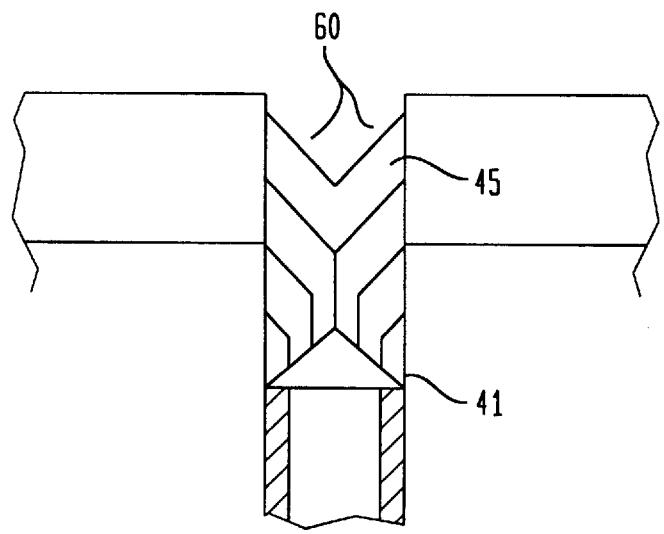
Figure 2G:
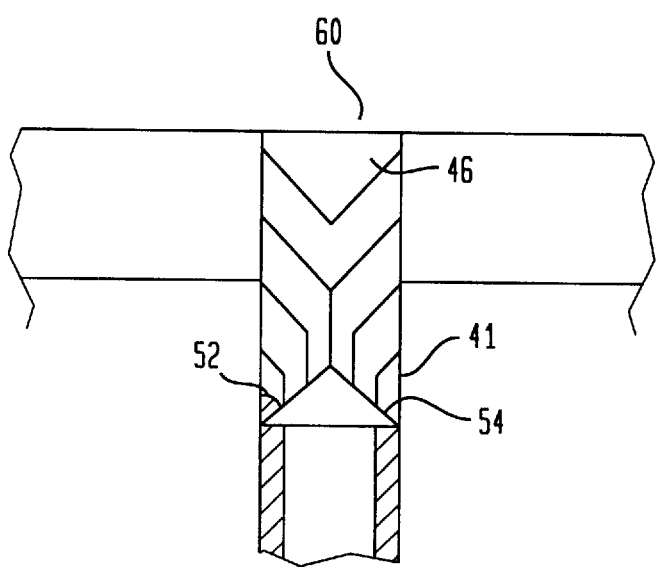
Figure 2H:
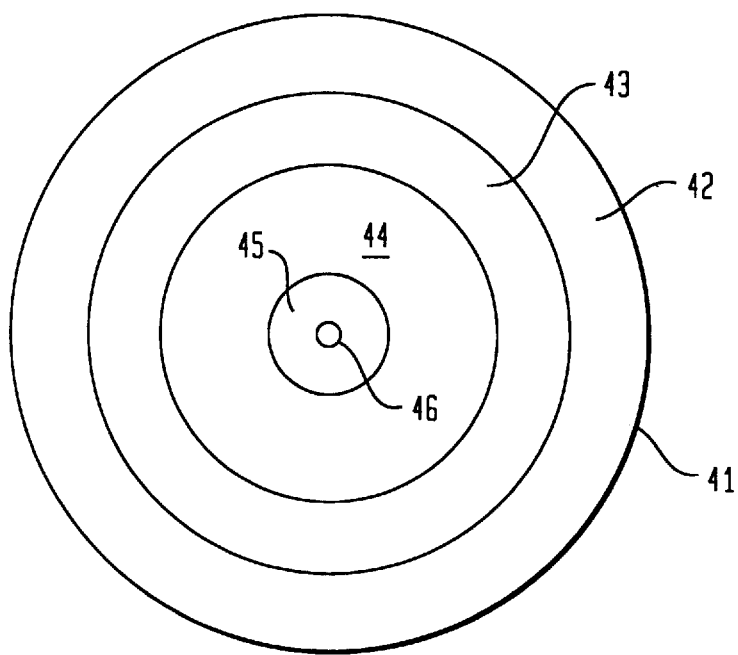
FIG. 2H depicts a top view of FIG. 2F showing the complete stages of epitaxial growth.

FIGS. 2C–2G depict the growing of a single crystalline silicon layer 60 from the trench sidewall 41, using selective epitaxy (epi). The different stages of growth of the single crystalline silicon epi layer 60 which starts from the trench sidewall 41 are numbered 42 to 46. A cross-sectional view of all of these growth stages appears in FIG. 2H. The single crystalline layer 60 will operate to substantially prevent excessive outdiffusion of N-type dopants present in the trench in subsequent DRAM processing. In FIG. 2C, the epi layer 60 starts growing with <111> facets 51 and (110) and (100) top planes 53 from the trench sidewall 41. The epi layer 60 grows as polysilicon 62 (ie. not crystalline) from the poly fill 72 into a cone-shaped region 56 (seen in full in FIG. 2E). In FIG. 2G, the polysilicon-epi interface 54 lies on a (111) plane (identical to those represented by 51), forming an angle 52 of 54.7 degrees with the trench sidewall 41. At the time indicated by the growth stage 44 (FIG. 2E), the epi fronts growing from the trench sidewalls merge and form a single crystalline layer 58 on top of the polysilicon cone 56.

The selective epitaxial growth process is performed at a temperature of between 800 and 1000 degrees Celsius with the reaction chamber pressure generally set between 1 and 80 torr. Hydrogen is pumped into the chamber at a flow rate of between 1 and 200 ml/sec, and the HCl gas flow rate is set between 100 and 1000 cm$^3$/sec in the reaction chamber. The epitaxial process can also be performed non-selectively by eliminating the HCl gas flow. In this case, an additional polishing and recess etching step is required.

Figure 3:
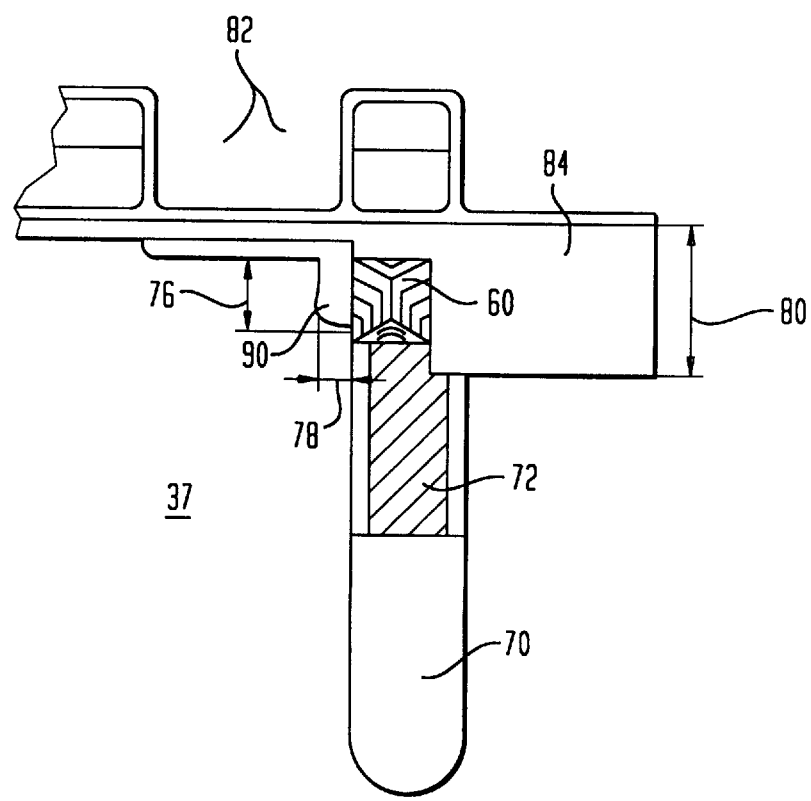
FIG. 3 depicts the epitaxially grown single crystalline silicon region as it appears in a 256 Mb DRAM cell constructed according to the present invention; and the resulting simulated buried strap outdiffusion after a thermal budget equal to 90 min at 1050° C. has been applied to this 256 Mb DRAM cell.

FIG. 3 illustrates the epitaxially grown single crystalline silicon region 60 as it appears in a 256 Mb DRAM cell after further processing in accordance with the present invention. As shown, a shallow trench isolation region 84 has been fabricated along with an active area 82 according to the standard POR 256 Mb process. Further DRAM processing forms a buried strap 90 on one side of the trench capacitor through controlled outdiffusion of N-(or P-)type dopants present in the trench.

Figure 1A:
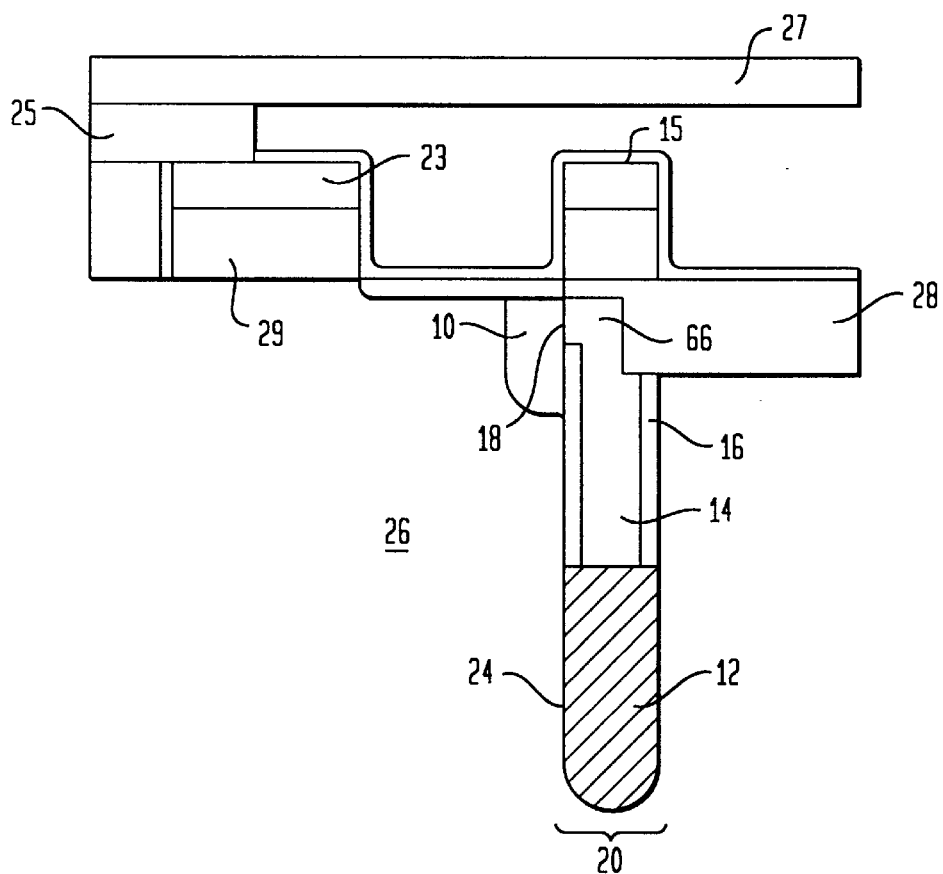
FIG. 1A depicts a cross-sectional side view through a conventional 256 Mb trench DRAM cell having a self-aligned buried strap made in accordance with prior art buried strap techniques.

Comparison of FIGS. 3 and 1A shows that the epitaxially grown single crystal silicon region 60 differs from the normal poly-silicon grain region 66 in that the crystalline layer is more capable of preventing excessive dopant outdiffusion during the processing steps that form the buried strap. This difference can be seen by comparing the buried strap 90 (FIG. 3) made according to the present invention to the buried strap 10 (FIG. 1A) made according to prior art techniques. After the growth of the single crystalline region 60, additional thermal budget, which is not possible using prior art techniques, may then be used for stress relief anneals in the surrounding area without excessive outdiffusion from the N-doped polysilicon 70 into the substrate region.

Figure 1B:
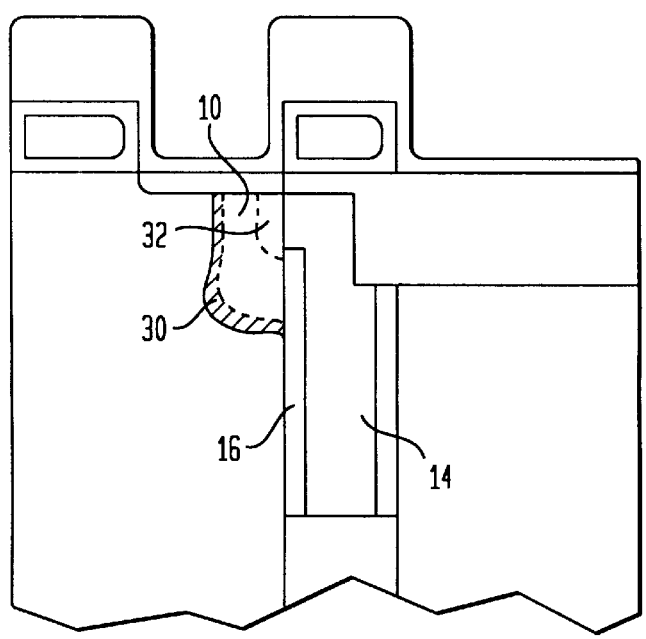
FIG. 1B depicts the simulated buried strap outdiffusion which occurs after a thermal budget equal to 90 min at 1050° C. has been applied to the DRAM cell of FIG. 1A.

The formation of the buried strap 90 (FIG. 3) was based on a thermal budget which did not include any stress anneals, plus an additional thermal budget for stress relief of 90 minutes at 1050° C., making it identical to the prior art process used in FIG. 1B that resulted in excessive buried strap outdiffusion 30. As can be seen from the simulated results in FIG. 3, the distance 78 of the buried strap outdiffusion laterally into the P-well 37 is less than 0.1 µm assuring that the short channel rolloff of the transfer device is not degraded. Additionally, the vertical depth 76 of the buried strap diffusion in FIG. 3 is less than the STI depth 80 assuring that there is no strap to strap leakage. For comparison purposes, FIG. 1B depicts an identical structure, simulated with the same thermal budget as in FIG. 3, but without the use of the epitaxial buried strap method. As can be seen in FIG. 1B, the buried strap outdiffusion 30 is excessive (about 0.15 µm laterally) and may be detrimental to the transfer device. Using the technique described herein, the strap 90 formed in FIG. 3 clearly approaches the size of an ideal strap 32 (in FIG. 1B).

As should now be apparent, the present invention substantially overcomes many of the problems associated with conventional buried straps in 256 Mb DRAM cells. In particular, the present invention allows for a greater thermal budget for fabrication of 256 Mb DRAM cells following the buried strap formation. The process also helps to prevent defect formation in the silicon substrate caused by uncontrolled recrystallization of the buried strap.

It should be understood that the embodiments described herein are merely exemplary and that a person skilled in the art may make reasonable variations and modifications to these embodiments utilizing functionally equivalent elements to those described herein. Any and all such variations or modifications as well as others which may become apparent to those skilled in the art, are intended to be included with the scope and spirit of the invention as defined by the appended claims.

What is claimed is:

1. A DRAM cell of a type including a trench storage capacitor having a trench formed in a substrate of semiconducting material having a dopant which causes said semiconducting material to be of a first conductivity, said trench being firstly lined with a second semiconducting material having a dopant which causes said second semiconducting material to be of a second conductivity, said dopant of said second conductivity also being partially diffused into said substrate, said trench being secondly lined with a layer of dielectric material and filled with a polysilicon material having a dopant which causes said polysilicon material to be of one of said first and second conductivities, and said trench being recess etched, lined with an oxide collar, and refilled with said polysilicon material which may be either doped or undoped; an access transistor formed on said substrate; and an electrically conductive region in said substrate, which connects said trench storage capacitor to said access transistor; the improvement therewith comprising:

a layer of single crystalline semiconducting material disposed in said trench wherein said single crystalline semiconducting material selectively controls the size of said electrically conductive region by limiting the out-diffusion of said dopant through said single crystalline semiconducting material during the formation of said access transistor.

2. A DRAM cell according to claim 1, wherein said conductive region is of a size which prevents electrical breakdown with an adjacently located DRAM cell.

3. A DRAM cell according to claim 1, wherein said single crystalline semiconducting material is grown from a sidewall of said trench by epitaxy (epi).

4. The DRAM cell according to claim 3, wherein said epitaxy is selective epitaxy.

5. The DRAM cell according to claim 3, wherein said epitaxy is non-selective epitaxy.

* * * * *